United States Patent
Beyer et al.

(10) Patent No.: US 7,885,369 B2
(45) Date of Patent: Feb. 8, 2011

(54) PLL FREQUENCY GENERATOR

(75) Inventors: Sascha Beyer, Ottendorf-Okrilla (DE); Ralf Jaehne, Ottendorf-Okrilla (DE)

(73) Assignee: ATMEL Automotive GmbH, Heilbronn (DE)

( * ) Notice: Subject to any disclaimer, the term of this patent is extended or adjusted under 35 U.S.C. 154(b) by 828 days.

(21) Appl. No.: 11/640,200

(22) Filed: Dec. 18, 2006

(65) Prior Publication Data
US 2007/0149144 A1  Jun. 28, 2007

(30) Foreign Application Priority Data
Dec. 17, 2005 (DE) .................. 10 2005 060 470

(51) Int. Cl.
*H03D 3/24* (2006.01)
(52) U.S. Cl. .................. 375/376; 375/375; 455/76; 327/153; 327/157
(58) Field of Classification Search .......... 455/76; 702/89, 189; 370/208; 327/153
See application file for complete search history.

(56) References Cited

U.S. PATENT DOCUMENTS

| | | | |
|---|---|---|---|
| 6,064,272 A | 5/2000 | Rhee | |
| 6,359,950 B2 * | 3/2002 | Gossmann et al. | 375/376 |
| 6,754,613 B2 * | 6/2004 | Tabatabaei et al. | 702/189 |
| 6,897,691 B2 * | 5/2005 | Chen et al. | 327/153 |
| 6,937,953 B2 * | 8/2005 | Nikutta | 702/89 |
| 6,944,121 B1 * | 9/2005 | Weste et al. | 370/208 |
| 7,084,710 B2 * | 8/2006 | Huang et al. | 331/16 |
| 2004/0041947 A1 * | 3/2004 | Williams | 348/536 |
| 2005/0105595 A1 * | 5/2005 | Martin et al. | 375/140 |

FOREIGN PATENT DOCUMENTS

| | | |
|---|---|---|
| DE | 102 57 185 B3 | 2/2004 |
| EP | 1434352 A1 | 6/2004 |
| WO | WO 86/07219 | 12/1986 |
| WO | WO 2004/088846 A1 | 10/2004 |

OTHER PUBLICATIONS

David Owen, "A New Approach to Fractional-N Synthesis," Electronic Engineering, Mar. 1, 1990, vol. 62, No. 759, Woolwich, London, GB; pp. 35-36, 38; XP000102103; ISSN: 0013-4902.

* cited by examiner

*Primary Examiner*—Edward Urban
*Assistant Examiner*—Golam Sorowar
(74) *Attorney, Agent, or Firm*—Muncy, Geissler, Olds & Lowe, PLLC (57) ABSTRACT

A PLL frequency generator is disclosed for generating an output signal with a settable target frequency, comprising a) a voltage-controlled oscillator for generating the output signal depending on a control voltage, b) a switchable frequency divider, which is connected to the voltage-controlled oscillator and is designed to derive a frequency-divided signal whose instantaneous frequency depends on a value of an adjustable divisor, from the output signal c) a switchable delay unit, which is connected to the frequency divider and is designed to generate a delayed signal in that the frequency-divided signal is delayed by delay times that in each case depend on a control word and a control signal, and d) a phase detector, which is connected to the switchable delay unit and is designed to determine the phase difference between a reference signal and the delayed signal and to provide it for the generation of the control voltage. According to the invention, a calibration unit is provided, which is connected to the switchable delay unit and is designed to derive the control signal from the reference signal.

25 Claims, 2 Drawing Sheets

PLL FREQUENCY GENERATOR

This nonprovisional application claims priority under 35 U.S.C. §119(a) on German Patent Application No. DE 102005060470, which was filed in Germany on Dec. 17, 2005, and which is herein incorporated by reference.

BACKGROUND OF THE INVENTION

1. Field of the Invention

The present invention relates to a PLL frequency generator (phase-locked loop). The further invention relates to a transmitting/receiving device and to an integrated circuit with a PLL frequency generator of this type.

2. Description of the Background Art

The invention falls within the field of telecommunications. It falls particularly within the field of PLL frequency generators, with whose help transmitting/receiving devices in telecommunication systems access spectrally spaced carrier frequency channels. Such PLL frequency generators derive an output signal with a settable target frequency from a highly precise reference signal and provide it as a local oscillator signal for receiver-side down-mixing of the incoming signal and/or for transmitter-side up-mixing. The settable target frequency can be selected hereby from a group of predefined target frequency values, the so-called frequency raster.

If the target frequency values each correspond to an integer multiple of the frequency of the reference signal ("reference frequency"), the frequency of the output signal can be divided in the feedback branch of the frequency generator by an integer divisor. Because of phase jitter, at the target frequency, the spectrum of the output signal of such an "integer-N" PLL frequency generator has a surrounding interference part, which determines the signal/noise ratio of the output signal, in addition to the desired spectral line.

However, if, for example, the minimum spacing between two neighboring target frequency values is smaller than the reference frequency, a frequency division by a non-integer divisor is necessary in the feedback branch of the frequency generator. Frequency divisions of this type are typically effected by switchable frequency dividers (multi-modulus divider, MMD), which in each case at times perform frequency divisions by different integer divisor values, in order to achieve the necessary non-integer frequency division within a time average. The switching between different integer divisor values, however, causes an additional, time-variant periodic phase error in the frequency-divided signal and thereby another interference part in the spectrum of the output signal in the form of spectral lines. Without further measures to compensate for the additional phase error, the output signal of this type of "fractional-N" PLL frequency generator therefore has a lower signal/noise ratio than a corresponding integer-N PLL frequency generator or a fractional-N PLL frequency generator operated in the integer mode.

U.S. Pat. No. 6,064,272 discloses a fractional-N PLL frequency generator, which has a phase compensation circuit, connected downstream to the switchable frequency divider, in the feedback branch. This phase compensation circuit with use of delay lines containing a variable plurality of delay elements provides a total of four different delayed variants of the frequency-divided signal, from which one is selected by the control circuit. Furthermore, a tuning circuit ("on-chip tuning circuit") is provided with 4 or 16 additional delay elements, which generates a control voltage for the delay elements. The control voltage is hereby derived from the VCO output signal (FIG. 3), from a fixedly, i.e., unchangeably, frequency-divided signal (FIG. 5), or from two variants, mutually phase-shifted, of the fixedly frequency-divided signal (FIG. 6). To match the delay elements, a control is provided, which is based on the VCO output signal, which is adjusted by the PLL.

It is a disadvantage here that the realization cost and the energy consumption of the phase compensation circuit and the tuning circuit at higher frequency resolutions (spacing between two neighboring target frequency values considerably smaller than the reference frequency) and/or at higher target frequency values, for example, in the GHz range, increases drastically and implementation of the frequency generator is therefore uneconomic or virtually no longer possible. It is disadvantageous, furthermore, that the tuning circuit must be operated continuously, which results in an additional energy consumption by the frequency generator.

SUMMARY OF THE INVENTION

It is therefore an object of the present invention to provide a PLL frequency generator, which is simple to implement and energy-efficient to operate also at higher frequency resolutions and/or higher target frequency values and moreover compensates instantaneously for the interference part, caused by the fractional-N division, in the output signal spectrum and therefore achieves a high signal/noise ratio, so that powerful transmitting/receiving devices can be realized simply, cost-effectively, and energy-efficiently. This should apply in particular also when there are parameter variations in the elements during production and/or operating voltage or parameter variations, e.g., due to temperature changes, aging effects, etc.

This object is achieved according to the invention by a PLL frequency generator, a transmitting/receiving device, and an integrated circuit.

The PLL frequency generator of the invention for generating an output signal with a settable target frequency comprises the following units: a) a voltage-controlled oscillator for generating the output signal depending on control voltage, b) a switchable frequency divider, which is connected to the voltage-controlled oscillator and is designed to derive a frequency-divided signal, whose instantaneous frequency depends on a value of an adjustable divisor, from the output signal, c) a switchable delay unit, which is connected to the frequency divider and is designed to generate a delayed signal in that the frequency-divided signal is delayed by delay times that in each case depend on a control word and a control signal, d) a phase detector, which is connected to the switchable delay unit and is designed to determine the phase difference between a reference signal and the delayed signal and to provide it for the generation of the control voltage, and e) a calibration unit, which is connected to the switchable delay unit and is designed to derive the control signal from the reference signal.

The transmitting/receiving device of the invention and the integrated circuit of the invention each have this type of PLL frequency generator.

Also, a calibration unit is provided that derives the control signal from the reference signal for calibrating the switchable delay unit. Instead of control based on the VCO output signal calibration therefore occurs on the basis of the highly precise reference signal. By this means, the additional phase error, caused by the fractional-N division, can be instantaneously compensated also at higher frequency resolutions and/or higher target frequency values with the saving of effort and operating energy, even when operating voltage variations, temperature effects, parameter variations, etc., are present. The downstream phase detector therefore "sees" only the remaining "integer-N" phase error, so that with the help of the invention the advantages of integer-N frequency generators (low phase jitter, high signal/noise ratio) can be combined with those of fractional-N frequency generators (high frequency resolution). Powerful integrated circuits and thereby also powerful transmitting/receiving devices can be realized for this reason simply, cost-effectively, and energy-efficiently.

Furthermore, the calibration advantageously can also occur when the PLL control loop has not (yet) reached its steady state, e.g., during activation of the PLL frequency generator. In addition, there is no continuous operation of the calibration unit, but only a, e.g., periodically repeating, short-time operation is needed, so that the PLL frequency generator of the invention can be operated especially energy-efficiently.

In an embodiment, the calibration unit derives two total delay times from the reference signal and adjusts the control signal in such a way that these total delay times differ by a predefined time interval.

The calibration unit can derive two signals with two edges from the reference signal and adjusts the control signal in such a way that there is a predefined time interval between the edges. This enables advantageously simple and energy-efficient realizations.

The predefined time interval is hereby derived from the period duration of the reference signal, whereby it corresponds preferably to the period duration of the reference signal or to a multiple of the period duration of the reference signal.

In another embodiment, the calibration unit to form a control signal-dependent first total delay time has a first (signal) path, controlled by the control signal, and to form a control signal-dependent second total delay time, a second (signal) path, controlled by the control signal, and is designed to adjust the control signal in such a way that the first total delay time differs from the second by a predefined non-vanishing value of an integer multiple K of the period duration of the reference signal. In this way, the calibration unit can be realized very simply and operated very energy-efficiently. If K=1 is selected here, especially simple and energy-efficient implementations are advantageously possible.

In another embodiment, the first path to form the first total delay time has a control signal-controlled first ring oscillator and the second path to form the second total delay time a control signal-controlled second ring oscillator, whereby the first and the second path are formed in such a way that the first total delay time differs from the second total delay time by the predefined nonvanishing value of the integer multiple K of the period duration, when the control signal is adjusted. As a result, the total delay times can be advantageously provided at very low hardware cost and operating energy. Preferably, the two ring oscillators are formed substantially identical.

In two additional embodiments, a) the first ring oscillator or the first path to form the first total delay time has at least one control signal-controlled first delay unit, which is designed to delay a signal, applied at its input, by a control signal-dependent first time interval, which corresponds to the non-vanishing delay time that the switchable delay unit generates when the control word assumes a first value, and b) the second oscillator or the second path to form the second total delay time has at least one control signal-controlled second delay unit, which is designed to delay a signal, applied at its input, by a control signal-dependent second time interval, which corresponds to the delay time that the switchable delay unit generates when the control word assumes a second value, whereby the second time interval is longer than the first time interval. Preferably, the first and the second delay units are hereby each formed substantially identical to the switchable delay unit. The first and the second values are preferably selected in such a way that the first total delay time differs from the second by the predefined nonvanishing value of the integer multiple K of the period duration, when the control signal is adjusted. In this way, the phase error can be efficiently corrected also at high frequency resolutions and/or target frequency values independent of the maximum delay time of an individual delay unit.

Further, the control signal can be designed as a control current. As a result, the analog control signal can be transmitted with little interference within an integrated circuit.

In another embodiment, a) the first path is designed to provide a first output signal with a first edge, b) the second path is designed to provide a second output signal with a second edge, c) the calibration unit has a phase detector circuit, which is designed to determine whether the first edge leads or lags behind the second edge and to generate a word of a digital signal, whose value represents a control signal value necessary in view of this determination. In this way, the calibration unit can be realized very simply and operated especially energy-efficiently.

In an embodiment, the PLL frequency generator has a calibration mode and is designed to supply the calibration unit with operating energy only when the calibration mode is active. In this way, the average energy consumption by the calibration unit and thereby by the frequency generator can be drastically reduced.

In another embodiment, a controller connected to the switchable delay unit is provided, which has a sigma-delta modulator and is designed to determine the control words depending on at least one signal provided by the sigma-delta modulator. With use of the sigma-delta modulator, spectral lines lying relatively close to the target frequency in the interference part of the spectrum of the output signal can be suppressed very effectively, so that an especially high signal/noise ratio results. Furthermore, this embodiment is simple to implement and energy-efficient to operate.

In another embodiment, the sigma-delta modulator has an accumulator, which is designed to accumulate an input signal from the sigma-delta modulator and to provide an accumulated signal, and the controller is designed to determine the control words depending on the accumulated signal. In this way, the control words can be determined very simply and energy-efficiently.

In an embodiment, the sigma-delta modulator has an order of two. This embodiment has a high efficiency with a very simple implementability and very low energy consumption.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

In the figures, the same and functionally identical elements and signals, if not specified otherwise, are provided with the same reference characters.

Figure 1:
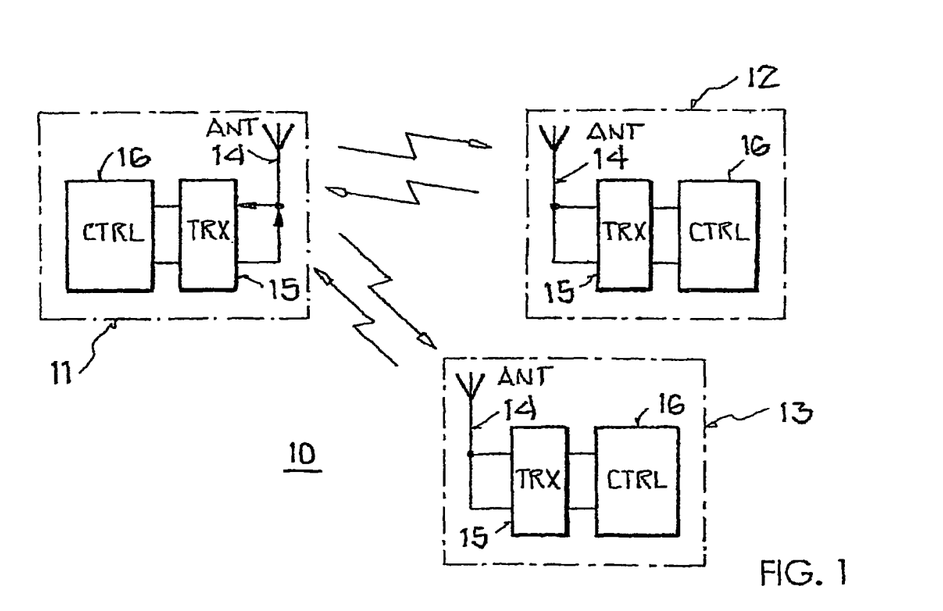
FIG. 1 is an example of a "Wireless Personal Area Network" (WPAN) according to the IEEE Standard 802.15.4 with transmitting/receiving devices of the invention.

So-called "Wireless Personal Area Networks" (WPANs) can be used for the wireless transmission of information over relatively short distances. FIG. 1 shows an example of a WPAN 10 according to the standard IEEE 802.15.4. This standard specifies low-rate WPANs, which are suitable with raw data rates up to a maximum of 250 kbit/s and stationary or mobile devices for applications in industrial monitoring and control, in sensor networks, in automation, and in the field of computer peripherals and for interactive games. In addition to a very simple and cost-effective implementability of the devices, an extremely low power requirement of the device is of critical importance for such applications. Thus, an objective of this standard is a battery life of several months to several years.

The WPAN shown in FIG. 1. comprises three transmitting/receiving devices 11-13 in the form of stationary or mobile devices, which exchange information in a wireless manner by means of radio signals. Transmitting/receiving device 11 is a full-function device, which takes on the function of the WPAN coordinator, whereas transmitting/receiving devices 12, 13 are reduced-function devices, which are assigned to the full-function device 11 and can only exchange data with said device. Apart from the star network topology depicted in FIG. 1, in which bidirectional data transmission can only occur between one of the reduced-function devices 12, 13 and the full-function device 11, but not between the reduced function devices 12, 13, the standard also provides for so-called "peer-to-peer" topologies, in which all full-function devices can communicate with all other full-function devices.

Transmitting/receiving devices 11-13 each comprise an antenna 14, a transmitting/receiving unit (transceiver, TRX) 15, connected to the antenna, for transmitting and receiving data according to IEEE 802.15.4, and a control unit (CTRL) 16, connected to the transmitting/receiving unit, to control the transmitting/receiving unit 15 according to IEEE 802.15.4. Furthermore, transmitting/receiving devices 11-13 each contain a power supply unit, not shown in FIG. 1, in the form of a battery, etc., to supply power to units 15, 16, and possibly other components (sensors, actuators, etc.).

It will be assumed in the following text that the data transmission occurs in the license-free 2.4-GHz ISM band (industrial, scientific, medical). The IEEE standard 802.15.4 provides a total of 16 channels at a spacing of 5 MHz each in this frequency band. In these channels, a band spreading (spreading) with a chip rate of fc=2 Mchip/s and an offset QPSK modulation (quaternary phase shift keying) are specified for raw data rates of fB=250 kbit/s.

The transmitting unit of each transmitting/receiving unit 15 converts the data stream, to be transmitted in each case, into a radio signal to be emitted via its antenna 14, by first transforming the data stream to be transmitted according to IEEE 802.15.4 into 4 bit wide symbols and these into successive PN sequences (pseudo-noise) of 32 chips each. The chips of the successive PN sequences are then offset-QPSK-modulated (quaternary phase shift keying), spectrally shifted into 1 of the 16 channels in the ISM frequency band with the use of a PLL frequency generator of the invention, and finally amplified for the transmission. Because an offset QPSK modulation with half-sinus pulse formation corresponds to an MSK modulation (minimum shift keying), i.e., an FSK modulation (frequency shift keying) with a modulation index of ½ or frequency deviation ΔF=fC/4=0.5 MHz, the PLL frequency generator within the scope of a direct frequency modulation can also take into account the additional frequency offset by means of the modulation signal.

The receiving unit of each transmitting/receiving unit 15 converts a radio signal, received by its antenna 14 and generated by the transmitting unit of another transmitting/receiving device according to IEEE 802.15.4, as error-free as possible into the transmitted data, in that the received radio signal is amplified, shifted spectrally into the baseband or into an intermediate frequency range with use of the aforementioned PLL frequency generator, and then demodulated, and finally the data are detected.

Transmitting/receiving unit 15 is hereby always a part of an integrated circuit (not shown in FIG. 1), e.g., an ASIC (application specific integrated circuit) or an ASSP (application specific standard product), whereas control unit 16 is realized in each case by a microcontroller (also not shown). Advantageously, each transmitting/receiving device has only one integrated circuit (e.g., made as ASIC or ASSP), which senses the functions of its transmitting/receiving unit 15 and its control unit 16.

Figure 2:
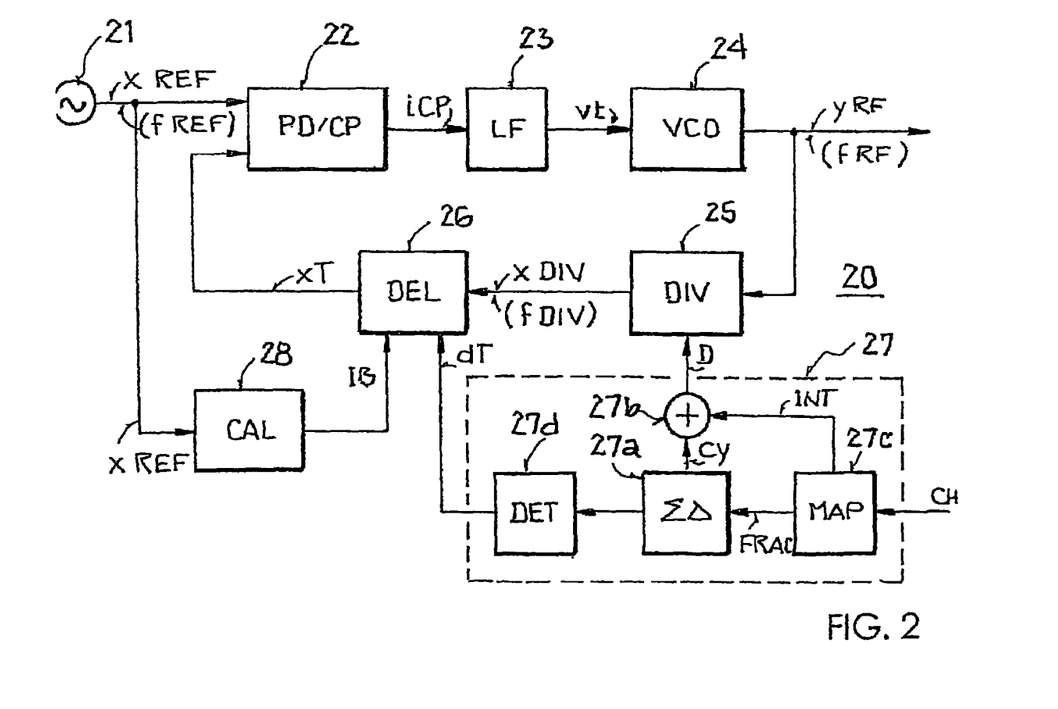
FIG. 2 illustrate embodiments of PLL frequency generators according to the invention.

FIG. 2 shows a block diagram of a PLL frequency generator for a transmitting/receiving unit 15 of FIG. 1. PLL frequency generator 20 has a reference oscillator 21, a phase (difference) detector/charge pump (PD/CP) 22, a loop filter (LF) 23, a voltage-controlled oscillator (VCO) 24, a switchable frequency divider (DIV) 25, a switchable delay unit (DEL) 26, a controller 27, and a calibration unit 28.

Reference oscillator 21 generates an optionally amplified reference signal xREF with a reference frequency fREF and is designed, e.g., as a quartz oscillator or as a voltage-controlled quartz oscillator.

PD/CP unit 22 (phase (difference) detector/charge pump) has a first input, connected to reference oscillator 21, and a second input, connected to the output of delay unit 26. PD/CP unit determines the phase deviation (phase difference) between the reference signal xREF, applied at the first input, and the delayed signal xT, applied at the second input, and provides a defined current iCP at its output depending on the phase deviation. A phase frequency detector can also be provided instead of the phase detector.

Loop filter (LF) 23 has an input, connected to PD/CP unit 22, and an output, connected to VCO 24. Depending on the current iCP, applied at the input, loop filter 23 generates a control voltage vt and provides this at its output.

Voltage-controlled oscillator (VCO) 24 has an input, connected to loop filter 23, and an output, connected to frequency divider 25. Depending on the control voltage vt applied at the input, VCO 24 generates an optionally additionally amplified output signal yRF with a settable target frequency fRF, dependent, e.g., on a channel index CH, and provides it at its output.

Switchable frequency divider (DIV) 25 has a signal input, connected to VCO 24, and a control input, connected to controller 27. From the VCO output signal yRF applied at its signal input, frequency divider 25 derives a frequency-divided signal xDIV, whose instantaneous frequency fDIV according to fDIV=fRF/D depends on the actual value of the adjustable divisor D, applied at its control input, and provides the frequency-divided signal xDIV at its output.

The value, which the divisor assumes, depends on the settable target frequency fRF or the corresponding channel index CH and on the reference frequency fREF of the reference signal xREF. If, for example, the difference between the target frequencies of two spectrally adjacent channels, i.e., the channel raster, is smaller than the reference frequency fREF (in this case, this is referred to as a "fine" frequency resolution), the divisor assumes a non-integer value at least for some target frequencies. In the exemplary case of a reference frequency of fREF=16 MHz, according to IEEE 802.15.4, the divisor value fRF/fREF=150.3125 results, for example, for the lowest target frequency (fRF=2405 MHz) in the ISM band.

To realize such non-integer divisor values, frequency divider circuit 25 is made switchable, whereby at times it performs frequency divisions with different integer divisor values D in such a way that the required non-integer divisor value results "on average" considered over a certain time interval. Frequency generators with such a switchable frequency divider are called fractional-N PLL frequency generators.

The variation of the values of the divisor D causes a time-variant phase error between the frequency-divided signal xDIV and the reference signal xREF, which modulates the VCO output signal yRF via loop filter 23 ("interference modulation"). In addition to the interference part due to phase noise, which is also present in integer-N PLL frequency generators, the spectrum of the VCO output signal yRF in fractional-N PLL frequency generators due to this time-variant periodic phase error has another interference part in the form of spectral lines around the target frequency fRF, which depends on the non-integer part of the non-integer divisor value to be realized on average. According to the invention these spectral lines are largely suppressed.

Frequency divider 25 can be a multi-modulus divider (MMD), i.e., a digital counter programmable within the count range. Advantageously, the MMD consists of two frequency dividers, whereby the first is also called a prescaler and is designed to undertake frequency divisions by N or N+1 and the second works with a typically fixed divisor ratio and controls the modulus input of the prescaler depending on the divisor D applied at the control input.

Switchable delay unit (DEL) 26 has a signal input, connected to frequency divider 25, and a first control input, connected to calibration unit 28 and a second control input connected to controller 27. Delay unit 26 creates a delayed signal xT, in that the frequency-divided signal xDIV, applied at its signal input, is delayed by delay times ΔT, each of which depend on a control signal IB applied at its first control input and on a digital control word dT, applied at its second control input, and provides the delayed signal xT at its output. The delay time ΔT hereby depends as follows on control signal IB and on control word dT:

$$\Delta T = A(IB) * (t0 + dT * ts) \quad (1)$$

Here, t0 designates a basic delay of, e.g., about 1 ns, ts the delay increment dependent on the frequency resolution, and A(IB) a function dependent on control signal IB. It is evident from equation (1) that the delay time ΔT depends substantially linearly on the respective control word dT. At an exemplary width of the control words of 7 bits, it is possible to set a total of 128 different delay times ΔT with each control word dT. Within delay unit 26, which is preferably realized on the basis of a CMOS buffer, the control word dT is converted into a current or a voltage, which sets the respective delay time ΔT except for an IB-dependent factor A(IB). The control word dT and the control signal IB determine the value of a discharge current, which discharges a capacitor at the output of the first inverter of the buffer. The control words dT and the control signal IB are determined by controller 27 or calibration unit 28 in such a way that the resulting delay times ΔT are suitable for instantaneously compensating for the time-variant phase error explained above.

Controller 27 has an input for supplying a parameter determining the target frequency fRF, such, as e.g., a channel index CH. Depending on the channel index CH, controller 27 determines the control words dT and provides them at its first output, connected to the second control input of delay unit 26. Preferably, controller 27 determines in addition the values of the adjustable divisor D depending on the channel index CH and provides them at its second output, connected to the control input of frequency divider 25.

Controller 27 has a sigma-delta modulator (ΣΔ) 27a, an adder 27b, a mapping unit (MAP) 27c, and a determination unit (DET) 27d for determining the control words dT. The channel index CH is supplied to mapping unit 27c on the input side. On the output side, the mapping unit is connected to sigma-delta modulator 27a and a first input of adder 27b. On the input side, at its second input, adder 27b is connected to sigma-delta modulator 27a and on the output side via the second output of controller 27 to frequency divider 25. Sigma-delta modulator 27a is connected on the input side to mapping unit 27c and on the output side to adder 27b and to dT determination unit 27d. dT determination unit 27d is connected on the input side to sigma-delta modulator 27a and on the output side via the first output of controller 27 to switchable delay unit 26.

Mapping unit 27c derives the values INT and FRAC from the channel index CH. The values INT and FRAC hereby together indicate the factor by which the reference frequency fREF must be multiplied to achieve the desired target frequency fRF in consideration of the channel indexes CH. The values INT and FRAC are determined such that the following equation applies:

$$(INT + FRAC/RES) * fREF = fRF. \quad (2)$$

The parameter RES hereby determines the frequency resolution of the frequency generator. The higher the value of the parameter RES, the higher the frequency resolution that is achieved, i.e., the finer the frequency raster or the closer together the settable target frequencies. With the exemplary values RES=32 and fREF=16 MHz, e.g., target frequencies can be set at a spacing of fREF/RES=0.5 MHz, which corresponds to a high frequency resolution compared with the reference frequency fREF. The parameter FRAC in this case assumes a value between zero and RES−1=31 and can therefore be represented by a 5 bit wide word. The increment ts of the delay times ΔT, to be set by the delay unit 26 according to equation (1) is advantageously ts=1/(fR*RES)≈0.012 ns.

If PLL frequency generator 20 is used transmitter-side for direct frequency modulation, mapping unit 27c is supplied in addition with the modulation signal (not shown in FIG. 2). Depending on the values of the modulation signal, now optionally changed target frequency values fRF result and thereby FRAC/INT values changed according to equation (2). Thereby, the values of divisor D and the control words dT also depend on the modulation signal. In the case of the aforementioned exemplary values and a two-step modulation signal with a frequency deviation of ΔF=0.5 MHz, generally only the FRAC value changes by ±1 depending on the actual value of the modulation signal. The modulation signal can be supplied in addition to a loop filter, made switchable, to achieve a more rapid transient oscillation.

Sigma-delta modulator 27a, to which the FRAC value is supplied, in the simplest case of a first-order sigma-delta modulator (M=1), determines a sequence cy of binary values (zeros and ones), whose relative frequency reflects the value FRAC/RES. With the aforementioned exemplary values of RES and fREF, for example, the value FRAC=16, which according to equation (2) stands for a frequency offset of 16*fREF/RES=16*0.5 MHz=8 MHz, leads to a sequence cy of zero and one values, whose numbers match. By analogy hereto, the FRAC values 0 or 31 lead to a sequence cy of zero values according to a vanishing frequency offset or to a sequence cy of one values according to a frequency offset of 31*0.5 MHz=15.5 MHz. Instead of two-step sequences with binary values, with use of a sigma-delta modulator of the order of two or higher (M≧2), higher-step sequences cy, e.g., with integer values between −1 and 2 (for M=2) can also be generated. Preferably, a second-order sigma-delta modulator is used.

In adder 27b, the cy values, generated by sigma-delta modulator 27a, are finally added to the INT value and the summed values INT+cy supplied as time-variant divisor D to switchable frequency divider 25. With use of this time-variant divisor D, which corresponds in the time average to the factor INT+FRAC/RES from equation (2), frequency divider 25 realizes the necessary frequency division.

The frequency division through a time-variant divider D=INT+cy causes an additional time-variant phase error, which is instantaneously compensated by switchable delay unit 26.

Determination unit (DET) 27d determines the control words dT preferably depending on an accumulated signal acc1, which is provided by an input-side accumulator of the sigma-delta modulator, which accumulates the FRAC values. Whereas in first-order sigma-delta modulators (M=1) the values of the control words dT agree with the values of the accumulated signal acc1, with sigma-delta modulators with an order of two or higher (M≧2) the difference between the output signal cy ("first overflow signal") of sigma-delta modulator 27a and the ("second") overflow signal cy1 of the accumulator is to be subtracted from the accumulated signal acc1.

With use of the sigma-delta modulator, spectral lines lying relatively close to the target frequency in the interference part of the spectrum of the VCO output signal can be suppressed very effectively, so that an especially high signal/noise ratio results in the useful frequency range. In addition, the sigma-delta modulator suppresses interferences, which are caused by possible nonlinearities of delay unit 26, which is particularly advantageous when the ratio FRAC/RES has a value close to zero or one. Alternatively, controller 27 may also have an accumulator instead of a sigma-delta modulator.

Calibration unit 28 is connected on the input side to reference oscillator 21 and on the output side to the first control input of delay unit 26. Calibration unit 28 derives the control signal IB from the reference signal xREF in such a way that it leads to delay times ΔT, with which delay unit 26 instantaneously compensates for the additional time-variant phase error.

To this end, calibration unit 28 preferably derives two total delay times T1, T2 from the reference signal xREF and sets the control signal IB in such a way that these total delay times T1, T2 differ by a predefined time interval. Preferably, calibration unit 28 derives two signals y1, y2 with two edges from the reference signal xREF and sets the control signal IB in such a way that there is a predefined time interval between these edges.

The predefined time interval is preferably derived from the period duration TREF=1/fREF of the reference signal xREF. Preferably, it corresponds to the period duration TREF of the reference signal or a multiple of this period duration TREF. Alternatively, the predefined time interval can correspond to a non-integer multiple of TREF or have a vanishing duration.

In an embodiment, calibration unit 28 to form a first total delay time T1, dependent on control signal IB, has a first (signal) path, controlled by the control signal, and to form a likewise IB-dependent second total delay time T2 a second (signal) path, controlled by the control signal, and is designed to adjust the control signal IB in such a way that the two total delay times T1, T2 differ from one another by a predefined nonvanishing value of an integer multiple K of the period duration TREF=1/fREF of the reference signal xREF (K=1, 2, 3, . . . ). As a result, the calibration unit can be realized very simply and operated very energy-efficiently. In the exemplary case of fREF=16 MHz, TREF=62.5 ns. Instead of integer multiples of TREF, other fixed time intervals, derived from the reference signal xREF, can be used in other embodiments.

The total delay times T1 and T2 are hereby determined primarily by the first or second delay units in the first or second path, which are formed (constructed, implemented) substantially identical to switchable delay unit 26 and are also activated by control signal IB, but to which predefined smaller values dT1 or higher values dT2 of the control word are supplied. Therefore, the first delay units in each case produce shorter delay times and the second delay units longer delay times ΔT1 or ΔT2, respectively, which depend in each case on control signal IB (see equation (1)). Essentially, multiplication of these shorter or longer delay times ΔT1 or ΔT2 finally yields the total delay times T1 or T2, which with a calibrated control signal IB differ from one another by the aforementioned value of an integer multiple K of the period duration TREF. In the uncalibrated state, the total delay times T1, T2, in contrast, generally do not differ from one another by an integer multiple K of TREF. Therefore, the control signal IB is adjusted in such a way that the total delay times T1, T2 differ by an integer multiple K of TREF.

The calibration of the invention therefore depends substantially on multiplying the variable part of the delay time of switchable delay unit 26, i.e., the time difference between a shorter and longer delay time ΔT according to equation (1), and on adjusting the control signal IB in such a way that the total time difference corresponds to an integer multiple K of the period duration TREF of the highly precise reference signal.

Figure 3:
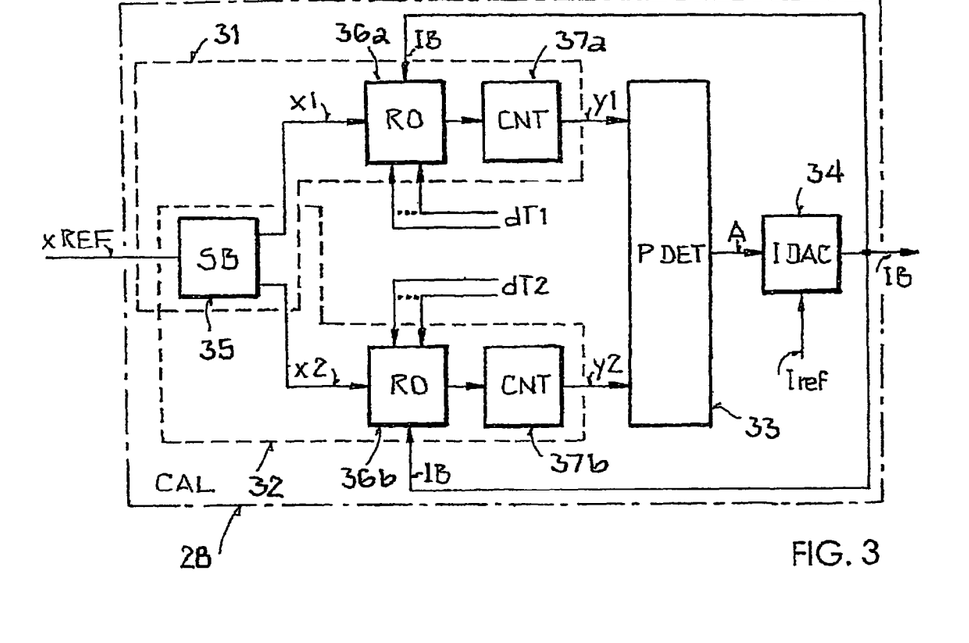
FIG. 3 illustrates a calibration unit according to an embodiment.
Figure 4:
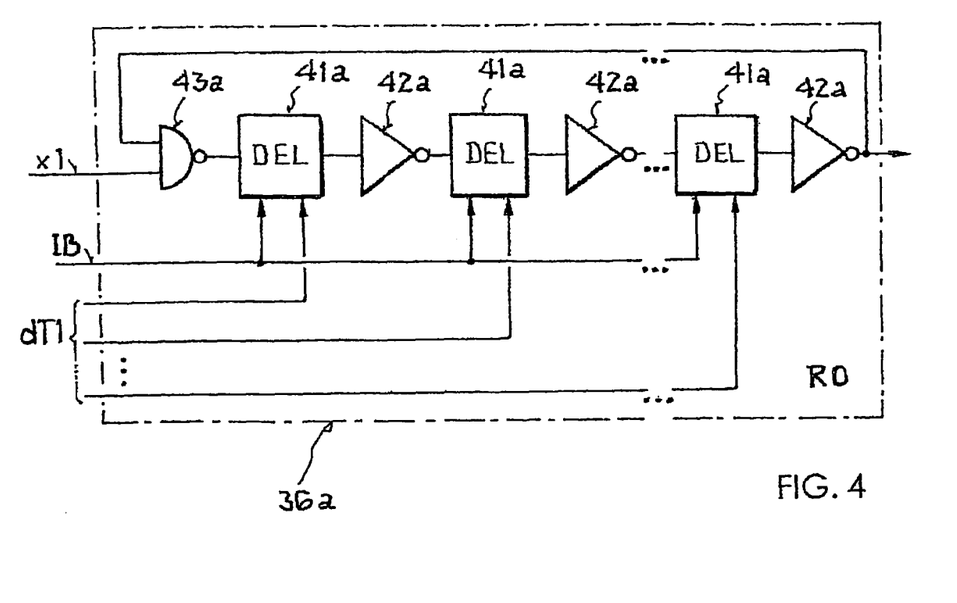
FIG. 4 illustrates a ring oscillator of the calibration unit of FIG. 3.

In the embodiments of the calibration unit described hereafter with reference to FIGS. 3 and 4, the first and second delay units are, by way of example, part of a first or second ring oscillator. In this way, delay times ΔT1 or ΔT2, caused by the individual first and second delay units, can be essentially multiplied with the saving of effort. As described above, here as well the first delay units are adjusted to delay times different from the second delay units, namely, such that in the calibrated state according to a predefined number of signal cycles in the first and second ring oscillator the first total delay time T1 differs from the second total delay time T2 by an integer multiple K of TREF. Instead of ring oscillators, naturally also an appropriately increased number of first and second delay units can be provided.

Preferably, the ring oscillators are also released with a time difference of K*TREF, whereby the ring oscillator with the longer delay times is started first. In this case, the output signal of the ring oscillators or paths with a calibrated control signal are in-phase after the predefined number of cycles, so that the calibration occurs based on a phase comparison of the output signal. Instead of aiming for the phase balance of the output signal, a phase difference can also be used, provided the ring oscillators are started at appropriately matched times, e.g., simultaneously.

To save operating energy, frequency generator 20 shown in FIG. 2 also has a calibration mode in addition to a normal operating mode. Calibration unit 28 is supplied with operating energy only when the frequency generator is in the calibration mode. Advantageously, the calibration mode is activated periodically but in each case only very briefly, for example, during activation of the frequency generator (i.e., before the VCO output signal yRF has reached the target frequency) and then, e.g., every 5 minutes, to compensate for slow variations, e.g., due to temperature changes, etc.

FIG. 3 shows a block diagram of a calibration unit 28 of the invention. Calibration unit (CAL) 28 has a first (signal) path 31, a second (signal) path 32, a phase detector circuit (PDET) 33 connected downstream to paths 31, 32, and a current supply unit (IDAC) 34 connected downstream to the phase detector circuit. Both paths 31, 32 are connected on the input side to reference oscillator 21 (see FIG. 2). Current supply unit 34 is connected on the output side to both switchable delay unit 26 (FIG. 2) and paths 31, 32.

The reference signal xREF of reference oscillator 21 is supplied in each case on the input side to paths 31, 32. The two paths derive a first or second output signal y1 or y2, whose phases are compared in phase detector circuit 33, from the reference signal xREF. Based on this comparison, phase detector circuit 33 generates a word of a digital signal A, whose value represents a control current IB necessary in view of the phase comparison. In current supply unit 34, this word of the digital signal A is converted to a control current IB, which is supplied to both switchable delay unit 26 and paths 31, 32. Instead of the preferred current supply unit 34 and the preferred control current (bias current) IB, alternatively a voltage supply unit or a control voltage can be provided.

First path 31 has the following units connected in series: signal supply unit (SB) 35 connected on the input side to reference oscillator 21, a first ring oscillator (RO) 36a, and a first counter or divider (CNT) 37a, which is connected on the output side to phase detector circuit 33. Analogous hereto, second path 32 has said signal supply unit 35, a second ring oscillator 36b, and a second counter or divider 37b, which is also connected on the output side to phase detector circuit 33. Ring oscillators 36a, 36b are formed (constructed) substantially identical and are each connected on the input side to current supply unit 34. Control words with the first values dT1 are supplied to first ring oscillator 36a, but control words with other second values dT2 to second ring oscillator 36b.

Signal supply unit (SB) 35 derives from the reference signal xREF a first signal x1 with a first (e.g., rising) edge and a second signal x2 with a second (e.g., rising) edge, whereby the two edges are separated by a time interval that corresponds to an integer multiple K of the period duration TREF of the reference signal xREF. The first edge (of x1) hereby establishes the time starting point of the first total delay time T1 to be formed in the first path, whereas the second edge (of x2) fixes the time starting point of the second total delay time T2 to be formed in the second path.

Preferably, the time interval of the two edges corresponds precisely to a period duration TREF. In this case (K=1), unit 35 is formed, e.g., as a series connection of two D-flip-flops each clocked with the reference signal xREF, whose outputs provide the signals x1 or x2.

Ring oscillators (RO) 36a, 36b are started with use of the two edges of the signals x1, x2 at a defined time interval (K*TREF) from one another. It is assumed below that first second ring oscillator 36b and then, a time interval of K*TREF later, first ring oscillator 36a are started. Of course, the opposite relation can also be provided.

After the specific start time, the ring oscillators on the output side generate pulses, whose period durations depend on the control signal IB and, in the case of the first ring oscillator 36a, the first values dT1 or, in the case of the second ring oscillator 36b, the second values dT2. The second values dT2 are selected here as higher than the first values dT1, so that the pulses generated by second ring oscillator 36b have a longer period duration than the pulses of the first ring oscillator 36a started later. Ring oscillators 36a, 36b are explained in greater detail below with reference to FIG. 4.

The counters or dividers (CNT) 37a and 37b count the pulses generated by ring oscillator 36a or 36b and upon reaching a predefined stop value Z generate a first (e.g., rising) edge in its (overflow) output signal y1 or a second (e.g., rising) edge in the output signal y2. These two edges establish the time endpoint of the first total delay time T1 or the second total delay time T2. The output signals y1, y2 of counters 37a, 37b are supplied to phase detector circuit 33. The two counters 37a, 37b are formed (constructed) substantially identical.

The dT1 and dT2 values for ring oscillators 36a, 36b and the stop value Z of counters 37a, 37b are selected in such a way that the first total delay time T1 differs from the second total delay time T2 as precisely as possible by the value K of the integer multiple (preferably K=1) of the period duration TREF, when the control signal IB is adjusted, i.e., calibrated.

Phase detector circuit (PDET) 33 determines whether the first edge of the output signal y1 leads or lags behind the second edge of the output signal y2. To this end, phase detector circuit 33 has, for example, cross-connected NAND gates on the input side. With the use of a downstream logic unit, phase detector circuit 33 determines a word of a digital signal A, whose value represents the control current IB necessary in view of the phase comparison between the two edges.

With use of a reference current Iref, current supply unit 34 (IDAC) converts the word of the digital signal A into the corresponding control current IB, whereby the relation IB=A*Iref+const. applies approximately. Current supply unit 34 is preferably designed as a digitally programmable current source.

Preferably, the setting of the control current IB occurs using the successive approximation method. Hereby, first the most significant bit of the words of the digital signal A is set according to the results of the phase comparison of y1 and y2 in phase detector circuit 33, whereas the less significant bits are temporarily set to zero. In current supply unit 34, the thus formed word A is converted into a control current IB, which is supplied inter alia to delay elements 41a, 41b of the ring oscillators. The output signals y1, y2 generated with this control current IB are then in turn compared by phase detector circuit 33 in their phase, and the second highest bit of the digital signal A is set correspondingly, etc., until the least significant bit of A is set. The bit width of A depends on the necessary setting accuracy for the delay time ΔT and is, for example, 6 bits.

FIG. 4 shows a block diagram of first ring oscillator 36a. This ring oscillator comprises a series connection of a first NAND gate 43a, a total of ND first delay units 41a, and a total of NI first inverters 42a, whereby the output of the series connection is fed back to a first input of the NAND gate 43a and the signal x1 is supplied to a second input of the NAND gate. The number NI of the first inverter is hereby even, whereby NI=ND, if ND is even, or NI=ND−1, if ND is odd. The control signal IB and first values dT1 of the control word are supplied to first delay units 41*a*. The dT1 values can differ hereby from delay unit 41*a* to delay unit 41*a*. Furthermore, individual dT1 values can be dependent on channel index CH or the target frequency fRF.

Second ring oscillator 36*b* is formed substantially identical as first ring oscillator 36*a* shown in FIG. 4. It comprises a second NAND gate 43*b*, a total of ND second delay units 41*b*, and a total of NI second inverters 42*b*, whereby these units are connected in analogy to FIG. 4 and are formed substantially identical to the corresponding units of FIG. 4. The control signal IB and second values dT2 of the control word are supplied to second delay units 41*b*, whereby the dT2 values can vary from delay unit 41*b* to delay unit 41*b* and individual dT2 values can also be dependent on channel index CH or the target frequency fRF. Second ring oscillator 36*b* therefore differs from first ring oscillator only in that dT2, instead of dT1, values and the signal x2, instead of x1, are supplied.

Each first delay unit 41*a* and each second delay unit 41*b* are hereby constructed substantially identical to switchable delay unit 26 of FIG. 2. The first and second inverters 42*a*, 42*b* assure that the specific delay units have a sufficient long recovery time, before they respond in a defined manner to the next edge.

Ring oscillators 36*a*, 36*b* are started by a high level at the input of the particular NAND gate 43*a*, 43*b*. Each first delay unit 41*a* delays the signal, applied at its input, by a first time interval $\Delta T1$ dependent on IB and the specifically applied dT1 value, whereas each second delay unit 41*b* delays the signal, applied at its input, by a second time interval $\Delta T2$ dependent on IB and the specifically applied dT2 value. Because of the substantially identical construction of delay units 41*a*, 41*b*, 26, the time intervals $\Delta T1$ or $\Delta T2$ correspond to the time intervals resulting from equation (1) for dT=dT1 or dT=dT2, i.e., the delay times $\Delta T$, which the switchable delay unit 26 would generate when the control word dT would assume the value dT1 or dT2. Because the dT2 value is greater than the dT1 value, the second time interval $\Delta T2$ is hereby longer than the first time interval $\Delta T1$. The total delay times T1, T2, explained with reference to FIG. 3, result from the sum of the time intervals $\Delta T1$ or $\Delta T2$ and the number of the signal cycles in the specific ring oscillator.

For example, ND=4 delay elements and NI=4 inverters can be provided per ring oscillator. The four dT1 values each assume, for example, the value 24, whereas two dT2 values assume a value of 100, the third dT2 value, depending on the channel index CH, the value 100 or 101, and the fourth dT2 value depending on channel index CH a value between 105 and 113.

The PLL frequency generator, described with reference to FIGS. 2 to 4, makes it possible to compensate for the phase error with a high accuracy and resolution. Resolutions of up to 8 bit and accuracies in the picosecond range are relatively simple to realize. Simulations by the applicant have shown that the interfering modulations can be suppressed in this way by about 40 dB. Calibration unit 28, described with reference to FIGS. 3 and 4, is simple to realize and energy-efficient to operate.

Whereas the PLL frequency generator, described with reference to FIG. 2, without a calibration unit has a current consumption of about 150 µA, the calibration unit 28, described with reference to FIGS. 3 and 4, requires a current on the order of 1 mA. Because the calibration unit does not perform a control but a calibration on the basis of the highly precise reference signal, it is sufficient to operate the calibration unit only very briefly in each case. As described above with reference to FIG. 2, the frequency generator for this purpose preferably has a calibration mode and supplies the calibration unit with operating energy only when the calibration mode is active, e.g., with the activation of the frequency generator, and then every 5 minutes. In this way, the average current consumption of the entire frequency generator can be drastically reduced in comparison with a continuous control.

Although the present invention was described above with reference to exemplary embodiments, it is not limited thereto but can be modified in many ways. Thus, the invention is not limited, for example, to WPANs per se or to WPANs according to IEEE 802.15.4, or the frequency bands, target frequency values, spectral masks, etc., specified therein. The invention is also not limited to a specific reference frequency, frequency resolution, or a specific architecture of the PLL, the delay unit, the frequency divider, or the controller. Rather, the invention can be used advantageously in highly diverse wireless or hard-wired communication systems.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A phase locked loop frequency generator for generating an output signal with a settable target frequency, the phase locked loop frequency generator comprising:
   a voltage-controlled oscillator for generating the output signal based on a control voltage;
   a switchable frequency divider connected to the voltage-controlled oscillator, for deriving a frequency-divided signal whose instantaneous frequency is based on a value of an adjustable divisor which divides the output signal;
   a switchable delay unit connected to the frequency divider for generating a delayed signal, the frequency-divided signal being delayed by delay times that are based on a control word and a control signal;
   a controller have a first output connected to said switchable frequency divider to provide said adjustable divisor and a second output connected to said switchable delay unit to provide said control word;
   a phase detector connected to the switchable delay unit for determining a phase difference between a reference signal and the delayed signal and for providing the phase difference for generating the control voltage; and
   a calibration unit connected to the switchable delay unit for deriving the control signal from the reference signal.

2. The phase locked loop frequency generator according to claim 1, wherein the calibration unit derives two total delay times from the reference signal and adjusts the control signal so that the total delay times differ by a predefined time interval.

3. The phase locked loop frequency generator according to claim 1, wherein the calibration unit derives two signals with two edges from the reference signal and to adjust the control signal so that there is a predefined time interval between the edges.

4. The phase locked loop frequency generator according to claim 2, wherein the predefined time interval is derived from the period duration of the reference signal.

5. The phase locked loop frequency generator according to claim 2, wherein the predefined time interval corresponds to the period duration of the reference signal or to a multiple of the period duration of the reference signal.

6. The phase locked loop frequency generator according to claim 1, wherein the calibration unit forms a first total delay time, which is dependent on the control signal, and has a first path controlled by the control signal, and forms a second total delay time, which is dependent on the control signal, and a second path controlled by the control signal, and adjusts the control signal so that the first total delay time differs from the second total delay time by a predefined nonvanishing value of an integer multiple of the period duration of the reference signal.

7. The phase locked loop frequency generator according to claim 6, wherein the calibration unit adjusts the control signal so that the first total delay time differs from the second total delay time by a period duration.

8. The phase locked loop frequency generator according to claim 6, wherein the first path forms the first total delay time and has a first ring oscillator controlled by the control signal, and the second path forms the second total delay time and has a second ring oscillator controlled by the control signal, wherein the first path and the second path are formed so that the first total delay time differs from the second total delay time by the predefined .nonvanishing value of the integer multiple of the period duration when the control signal is adjusted.

9. The phase locked loop frequency generator according to claim 8, wherein the first ring oscillator and the second ring oscillator are substantially identical.

10. The phase locked loop frequency generator according to claim 8,
wherein the first ring oscillator has at least one first delay unit controlled by the control signal, which delays a signal, applied at its input by a first time interval that is dependent on the control signal, which corresponds to the nonvanishing delay time that the switchable delay unit generates when the control word assumes a first value,
wherein the second ring oscillator has at least one second delay unit controlled by the control signal, which delays a signal, applied at its input by a second time interval that is dependent on the control signal, which corresponds to the delay time that the switchable delay unit generates when the control word assumes a second value, and
wherein the second time interval is longer than the first time interval.

11. The phase locked loop frequency generator according to claim 6,
wherein the first path forms the first delay time and has at least one first delay unit controlled by the control signal, which delays a signal applied at its input by a first time interval that is dependent on the control signal, which corresponds to the nonvanishing delay time that the switchable delay unit generates when the control word assumes a first value,
wherein the second path forms the second total delay time and has at least one second delay unit controlled by the control signal, which delays a signal that is applied at its input by a second time interval controlled by the control signal, which corresponds to the delay time that the switchable delay unit generates when the control word assumes a second value, and
wherein the second time interval is longer than the first time interval.

12. The phase locked loop frequency generator according to claim 10, wherein the first delay unit, the second delay unit, and the switchable delay unit are substantially identical.

13. The phase locked loop frequency generator according to claim 10, wherein the first value or first values and the second value or second values are selected in such a way that the first total delay time differs from the second total delay time by the predefined nonvanishing value of the integer multiple of the period duration when the control signal is adjusted.

14. The phase locked loop frequency generator according to claim 6, wherein the first path provides a first output signal with a first edge, wherein the second path provides a second output signal with a second edge, and wherein the calibration unit has a phase detector circuit, which determines whether the first edge leads or lags behind the second edge, and generates a word of a digital signal whose value represents a control signal value necessary in view of this determination.

15. The phase locked loop frequency generator according to claim 1, wherein the control signal is a control current.

16. The phase locked loop frequency generator according claim 1, wherein the phase locked loop frequency generator has a calibration mode and supplies the calibration unit with operating energy only when the calibration mode is active.

17. The phase locked loop frequency generator according to claim 1, further comprising a control unit operably connected to the switchable delay unit for determining the control words.

18. The phase locked loop frequency generator according to claim 17, wherein the controller has a sigma-delta modulator and determines the control words depending on at least one signal provided by the sigma-delta modulator.

19. The phase locked loop frequency generator according to claim 18, wherein the sigma-delta modulator has an accumulator, which accumulates an input signal from the sigma-delta modulator and provides an accumulated signal, and wherein the controller determines the control words based on the accumulated signal.

20. The phase locked loop frequency generator according to claim 19, wherein the controller has a sigma-delta modulator of a second or higher order, which provides a first overflow signal and a second overflow signal, and wherein the controller determines the control words based on the first and second overflow signals.

21. The phase locked loop frequency generator according to claim 20, wherein a second-order sigma-delta modulator is provided.

22. The phase locked loop frequency generator according to claim 1, wherein the phase locked loop frequency generator is an integrated circuit.

23. A transmitting/receiving device for a data transmission system, comprising:
an antenna;
a transmitting/receiving unit connected to the antenna, for transmitting and receiving data; and
a phase locked loop frequency generator comprising:
a voltage-controlled oscillator for generating the output signal based on a control voltage;
a switchable frequency divider connected to the voltage-controlled oscillator, for deriving a frequency-divided signal whose instantaneous frequency is based on a value of an adjustable divisor which divides the output signal;
a switchable delay unit connected to the frequency divider for generating a delayed signal, the frequency-divided signal being delayed by delay times that are based on a control word and a control signal;
a controller have a first output connected to said switchable frequency divider to provide said adjustable divisor and a second output connected to said switchable delay unit to provide said control word
a phase detector connected to the switchable delay unit for determining a phase difference between a reference signal and the delayed signal and for providing the phase difference for generating the control voltage; and a calibration unit connected to the switchable delay unit for deriving the control signal from the reference signal.

24. The transmitting/receiving device according to claim 23, wherein data is transmitted and/or received according to IEEE 802.15.4.

25. A phase locked loop frequency generator for generating an output signal with a settable target frequency, the phase locked loop frequency generator comprising:

a voltage-controlled oscillator configured to generate the output signal based on a control voltage;

a switchable frequency divider connected to the voltage-controlled oscillator, the switchable frequency divider being configured to derive a frequency-divided signal whose instantaneous frequency is based on a value of an adjustable divisor which divides the output signal;

a switchable delay unit connected to the frequency divider, the switchable delay unit being configured to generate a delayed signal, the switchable delay unit having a first input and a second input, the frequency-divided signal being delayed by delay times that are based on a control word applied to the first input of the switchable delay unit and a control signal applied to the second input of the switchable delay unit;

a controller having a first output connected to said switchable frequency divider to provide the adjustable divisor and a second output connected to the first input of the switchable delay unit to provide the control word;

a phase detector connected to the switchable delay unit, the phase detector being configured to determine a phase difference between a reference signal and the delayed signal and for providing the phase difference for generating the control voltage; and a calibration unit connected to the second input of the switchable delay unit, the calibration unit being configured to derive the control signal only from the reference signal.

* * * * *